(12) United States Patent
Mohindra

(10) Patent No.: US 12,372,561 B2
(45) Date of Patent: Jul. 29, 2025

(54) SYSTEM AND METHOD FOR MEASURING MODULATION DISTORTION ERROR VECTOR MAGNITUDE (EVM) OF A DEVICE UNDER TEST (DUT)

(71) Applicant: Keysight Technologies, Inc., Santa Rosa, CA (US)

(72) Inventor: Rishi Mohindra, Santa Clara, CA (US)

(73) Assignee: KEYSIGHT TECHNOLOGIES, INC., Santa Rosa, CA (US)

( * ) Notice: Subject to any disclaimer, the term of this patent is extended or adjusted under 35 U.S.C. 154(b) by 108 days.

(21) Appl. No.: 18/237,926

(22) Filed: Aug. 25, 2023

(65) Prior Publication Data
US 2025/0067782 A1    Feb. 27, 2025

(51) Int. Cl.
*G01R 23/20* (2006.01)
*G01R 29/06* (2006.01)

(52) U.S. Cl.
CPC ............. *G01R 23/20* (2013.01); *G01R 29/06* (2013.01)

(58) Field of Classification Search
CPC .............................. G01R 23/20; G01R 29/06
USPC .......................................................... 324/620
See application file for complete search history.

(56) References Cited

U.S. PATENT DOCUMENTS

| | | | |
|---|---|---|---|
| 10,756,829 B1 | 8/2020 | Therrien | |
| 10,841,019 B1 | 11/2020 | Shah et al. | |
| 11,595,137 B1 | 2/2023 | Mohindra | |
| 11,646,836 B2 | 5/2023 | Mohindra | |
| 2002/0074996 A1* | 6/2002 | Holzl | G01N 27/9046 324/240 |
| 2016/0018450 A1* | 1/2016 | Tan | G01R 27/28 702/69 |
| 2017/0227622 A1* | 8/2017 | Aydin | G01R 27/28 |

FOREIGN PATENT DOCUMENTS

EP    4145151 A1    3/2023

OTHER PUBLICATIONS

Yannick Gruson et al., "Artifacts and errors in cross-spectrum phase noise measurements," Metrologia 57 (Aug. 2020), pp. 1-13.

* cited by examiner

*Primary Examiner* — Raul J Rios Russo

(57) ABSTRACT

Measuring MDEVM of a DUT includes splitting an RF signal output by a DUT into first and second RF signals; acquiring and digitizing the first and second RF signals in first and second channels without demodulating the first and second RF signals; performing equalization of the first and second RF signals; measuring first and second modulation distortion (MD) error vectors of the equalized first and second RF signals; performing cross-correlation of the first and second MD error vectors across the first and second channels; averaging the cross-correlated MD error vectors over symbols and packets of the RF signal; and dividing the averaged cross-correlated MD error vectors by signal power of an ideal signal to obtain cross-correlated MDEVMs over a time period or bandwidth of a waveform of the RF signal, where performing the cross-correlation suppresses contribution of uncorrelated noise.

20 Claims, 7 Drawing Sheets

SYSTEM AND METHOD FOR MEASURING MODULATION DISTORTION ERROR VECTOR MAGNITUDE (EVM) OF A DEVICE UNDER TEST (DUT)

BACKGROUND

Test instruments, such as oscilloscopes and vector network analyzers (VNAs), contribute random noise and distortions when measuring radio frequency (RF) signals output by a device under test (DUT), particularly during digitization of the RF signals. The random noise and distortions reduce quality of the measurements. Modulation distortion (MD), in particular, may be measured using MD error vector magnitude (EVM). Informally, EVM may be considered a measure of how far actual constellation points of an RF signal are deviating from their ideal locations. That is, a digitally-modulated RF signal transmitted by an ideal RF transmitter would have all constellation points precisely at their ideal locations. However, with real RF devices and systems, various factors in the implementation, such as modulation distortion, phase noise, carrier leakage and low image rejection ratio, may cause the actual constellation points to deviate from their ideal locations. EVM is a measurement of such deviations.

Conventional techniques for measuring modulation distortion EVM (MDEVM) of a DUT are standards based, receiving and measuring time domain RF signals in a single receiver channel, demodulating the signal and extracting the constellation errors as error vector samples. Therefore, noise introduced by the receiver effects the accuracy of the measurement of the EVM of the DUT. In addition, demodulation of the RF signals is required to compute demodulated error vector samples, instead of extracting such error vector samples directly from the signal waveform. To mitigate the noise contributed by the measurement system receiver and demodulator, two channels of receiver and demodulator can be used, and a cross-correlation can be performed between the two sets of demodulated signals. Therefore, even if cross-correlation were to be performed, the demodulation and subsequent multiplication of one demodulated signal or its demodulated error vectors by the complex conjugate of the other signal or demodulated error vectors would be computationally difficult. Further, anti-correlated noise is introduced by power splitters used to split an input RF signal into multiple channels, and leakage noise is introduced between the multiple channels, all of which cause additional error and further distortion in subsequent DMEVM measurements.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1:
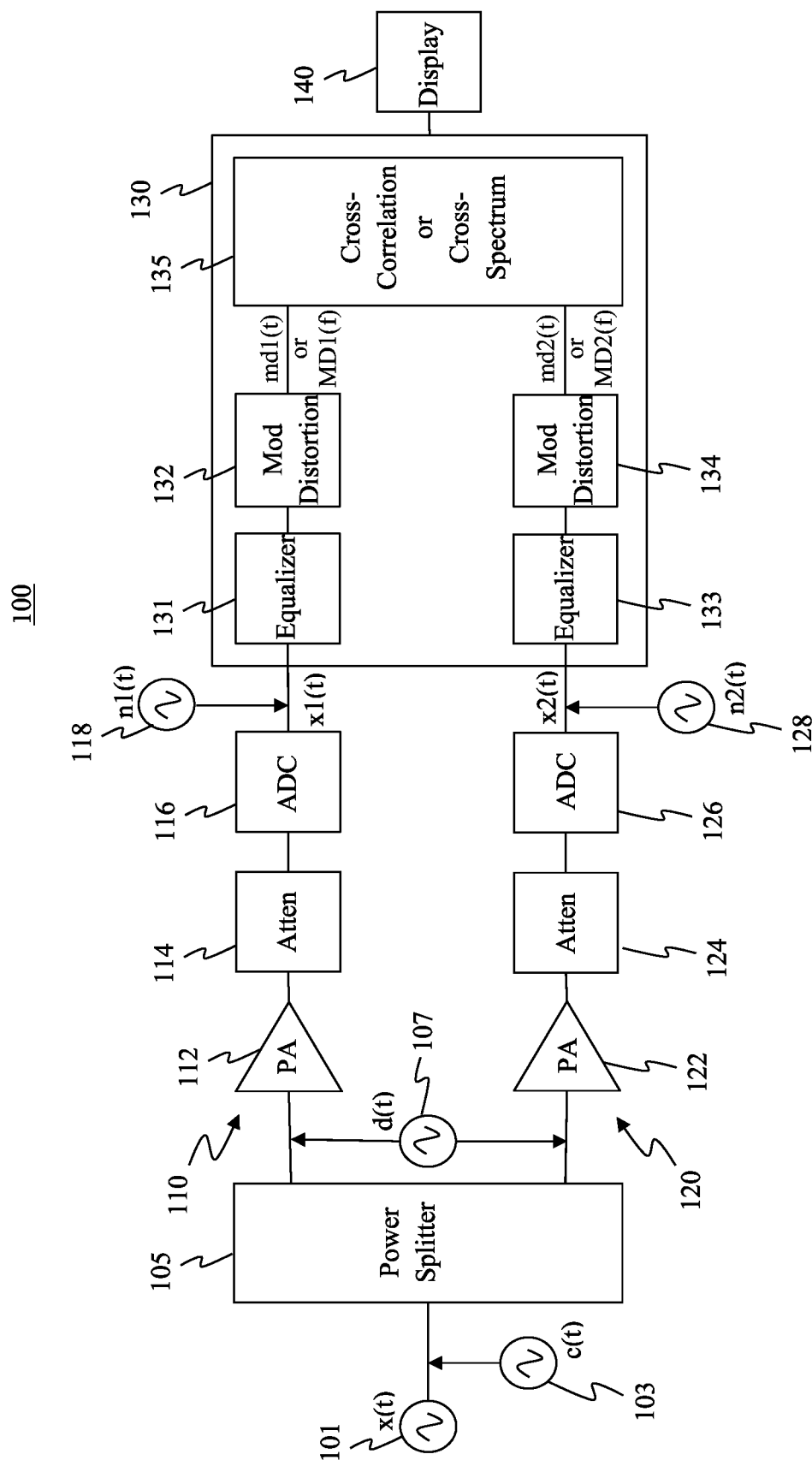
FIG. 1 is a simplified block diagram of a test system for making measurements of a SUT, according to a representative embodiment.

In the following detailed description, for purposes of explanation and not limitation, representative embodiments disclosing specific details are set forth in order to provide a thorough understanding of an embodiment according to the present teachings. Descriptions of known systems, devices, materials, methods of operation and methods of manufacture may be omitted so as to avoid obscuring the description of the representative embodiments. Nonetheless, systems, devices, materials and methods that are within the purview of one of ordinary skill in the art are within the scope of the present teachings and may be used in accordance with the representative embodiments. It is to be understood that the terminology used herein is for purposes of describing particular embodiments only and is not intended to be limiting. The defined terms are in addition to the technical and scientific meanings of the defined terms as commonly understood and accepted in the technical field of the present teachings.

It will be understood that, although the terms first, second, third etc. may be used herein to describe various elements or components, these elements or components should not be limited by these terms. These terms are only used to distinguish one element or component from another element or component. Thus, a first element or component discussed below could be termed a second element or component without departing from the teachings of the present disclosure.

The terminology used herein is for purposes of describing particular embodiments only and is not intended to be limiting. As used in the specification and appended claims, the singular forms of terms "a," "an" and "the" are intended to include both singular and plural forms, unless the context clearly dictates otherwise. Additionally, the terms "comprises," and/or "comprising," and/or similar terms when used in this specification, specify the presence of stated features, elements, and/or components, but do not preclude the presence or addition of one or more other features, elements, components, and/or groups thereof. As used herein, the term "and/or" includes any and all combinations of one or more of the associated listed items.

Unless otherwise noted, when an element or component is said to be "connected to," "coupled to," or "adjacent to" another element or component, it will be understood that the element or component can be directly connected or coupled to the other element or component, or intervening elements or components may be present. That is, these and similar terms encompass cases where one or more intermediate elements or components may be employed to connect two elements or components. However, when an element or component is said to be "directly connected" to another element or component, this encompasses only cases where the two elements or components are connected to each other without any intermediate or intervening elements or components.

The present disclosure, through one or more of its various aspects, embodiments and/or specific features or sub-components, is thus intended to bring out one or more of the advantages as specifically noted below. For purposes of explanation and not limitation, example embodiments disclosing specific details are set forth in order to provide a thorough understanding of an embodiment according to the present teachings. However, other embodiments consistent with the present disclosure that depart from specific details disclosed herein remain within the scope of the appended claims. Moreover, descriptions of well-known apparatuses and methods may be omitted so as to not obscure the description of the example embodiments. Such methods and apparatuses are within the scope of the present disclosure.

The various embodiments are in the technical field of measuring and testing electrical devices, and are directed to measuring modulation distortion (MD) error vector magnitude (EVM) (MDEVM), or waveform EVM, of an RF signal output by a DUT, or signal under test (SUT), including removing noise contributed by the test system, in order to determine fidelity of the RF signal at the output of the DUT. The embodiments include performing MDEVM measurements of RF signals that have been received but not demodulated in two independent receiver channels, and performing cross-correlation of the MDEVM measurements across the two independent receiver channels to suppress the noise contribution of the receivers to the MDEVM measurements. The MDEVM measurements may be made in the time domain or the frequency domain, without departing from the scope of the present teachings, and work on any arbitrary waveform. MDEVM of an RF signal output by a DUT is a practical measurement made in testing and evaluating the DUT and/or the RF signal.

In the time domain, the MD error vectors are cross-correlated per time sample in the occupied waveform duration, and in the frequency-domain, the MD error vectors are cross-correlated using error vectors per frequency sample in the occupied waveform bandwidth. These cross-correlated MD error vector samples are then averaged over symbols and packets to improve the processing gain by $P=5*\log 10(N)$ dB, where N is the number of cross-correlation samples averaged.

In either the frequency or time domain, the averaged cross-correlated MD error vectors are divided by signal power of an ideal signal to obtain cross-correlated MDEVMs over a time period or bandwidth of a waveform of the RF signal. The cross-correlated MDEVM measurements may be further averaged over the respective domains (time samples for time domain or frequency samples for frequency domain) to provide aggregate cross-correlated MDEVMs for each symbol, for each packet, or for all packets. The noise of the receiver is suppressed by the processing gain of P dB in the computation of the MDEVM.

In addition, coherent averaging may be performed on the RF signals in each of the first and second channels prior to the MD error vector measurements and cross-correlation to eliminate random noise introduced by the DUT and the test system, in which case the cross-correlated MD error vectors and the cross-correlated MDEVMs are obtained from only the distortion component of the waveform. By extracting the noise relative to the coherently averaged waveform, the noise component of the MD error vector measurements may be computed. By cross-correlating the extracted noise from the first and second channels, the noise of the receivers can be suppressed and the noise from the DUT and its contribution to the cross-correlated MDEVMs may be computed, improving the processing gain by $P=5*\log 10(N)$ dB.

According to a representative embodiment, a method is provided for measuring MDEVM of a DUT. The method includes splitting an RF signal output by the DUT into a first RF signal and a second RF signal using a power splitter; acquiring and digitizing the first RF signal in a first channel and the second RF signal in a second channel without demodulating either of the first RF signal or the second RF signal, wherein the first and second channels are independent; performing time-alignment, phase alignment and complex equalization, of the first RF signal in the first channel and the second RF signal in the second channel in order to refer each of the first RF signal and the second RF signal to an ideal signal; measuring first MD error vectors of the equalized first RF signal in the first channel and second MD error vectors of the equalized second RF signal in the second channel using a digital signal processor (DSP); performing cross-correlation between the first and second MD error vectors across the first and second channels to provide cross-correlated MD error vectors of the RF signal output by the DUT; averaging the cross-correlated MD error vectors over symbols and packets of the RF signal; and dividing the averaged cross-correlated MD error vectors by signal power of the ideal signal to obtain cross-correlated MDEVMs over a time period or bandwidth of a waveform of the RF signal. Performing the cross-correlation of the first and second MD error vectors and averaging of the cross-correlated MD error vectors suppress contribution of uncorrelated noise introduced by the first and second channels to the first and second MD error vectors, respectively.

According to another representative embodiment, a system is provided for measuring MDEVM of a DUT. The system includes a power divider configured to split an RF signal output by the DUT into a first RF signal and a second RF signal; a first channel configured to acquire and digitize the first RF signal without demodulating the first RF signal; a second channel configured to acquire and digitize the second RF signal without demodulating the second RF signal; a processing unit and a memory storing instructions. When executed by the processing unit, the instructions cause the processing unit to perform time alignment, phase alignment and complex equalization of the first RF signal from the first channel and the second RF signal from the second channel; measure first MD error vectors of the equalized first RF signal and second MD error vectors of the equalized second RF signal; perform cross-correlation of the first and second MD error vectors across the first and second channels to provide cross-correlated MD error vectors of the RF signal output by the DUT; average the cross-correlated MD error vectors over symbols and packets of the RF signal; and divide the averaged cross-correlated MD error vectors by signal power of the ideal signal to obtain cross-correlated MDEVMs over a time period or bandwidth of a waveform of the RF signal. Performing the cross-correlation of the first and second MD error vectors and averaging of the cross-correlated MD error vectors suppress contribution of uncorrelated noise introduced by the first and second channels to the first and second MD error vectors, respectively.

According to another representative embodiment, a non-transitory computer readable medium stores instructions for measuring MDEVM of a DUT that outputs an RF signal, which is split by a power divider into a first RF signal and a second RF signal, where the first RF signal is acquired and digitized in a first channel without being demodulated and the second RF signal is acquired and digitized in a second channel without being demodulated. When executed by a processing unit, the instructions cause the processing unit to perform time alignment, phase alignment and complex equalization of the first RF signal from the first channel and the second RF signal from the second channel; measure first MD error vectors of the equalized first RF signal and second MD error vectors of the equalized second RF signal; perform cross-correlation of the first and second MD error vectors across the first and second channels to provide cross-correlated MD error vectors of the RF signal output by the DUT; average the cross-correlated MD error vectors over symbols and packets of the RF signal; and divide the averaged cross-correlated MD error vectors by signal power of the ideal signal to obtain cross-correlated MDEVMs over a time period or bandwidth of a waveform of the RF signal. Performing the cross-correlation of the first and second MD error vectors and averaging of the cross-correlated MD error vectors suppress contribution of uncorrelated noise introduced by the first and second channels to the first and second MD error vectors, respectively.

FIG. 1 is a simplified block diagram of a test system for measuring MDVM in RF signals output by a DUT, according to a representative embodiment.

Referring to FIG. 1, test system 100 may be an oscilloscope or a vector network analyzer (VNA), for example, having multiple channels, indicated by first channel 110 and second channel 120, for measuring radio frequency (RF) signals output by DUT 101, which is represented as a signal source, such as a wireless mobile device, a WiFi transceiver, a power amplifier, or other device that transmits RF signals, for example. That is, the test system 100 receives a signal under test (SUT) output by a DUT 101, which may be a repeating waveform including symbols and packets. The SUT may be generated by the DUT 101 directly or output by the DUT 101 in response to a stimulus signal. The DUT 101 may be referred to as the "source," the RF signal x(t) output by DUT 101 may be referred to as the "source signal", and its input signal may be referred to as "ideal signal." The random or common mode noise of the DUT is c(t), discussed below, which contributes to the true MDEVM.

While making the measurements, errors are introduced by the test system 100, including correlated error that originates in sources common to both the first and second channels 110 and 120, such as a common clock or timebase, and uncorrelated error that originates in the first and second channels 110 and 120, respectively. The DUT 101 introduces common mode noise c(t) to the RF signal x(t), where the common mode noise c(t) is represented as common mode noise source 103. The RF signal x(t) and the common mode noise c(t) must be resolved accurately for the MDEVM measurement. In order to provide accurate measurements of MDEVM, the test system 100 must minimize or remove the uncorrelated error from the first and second channel noise n1(t) and n2(t), and to compensate for other types of error, including differential error d(t) and first and second leakage error hn1(t) and hn2(t), discussed below.

The test system 100 includes a power splitter 105 configured to receive the RF signal output by DUT 101, and to split the RF signal into a first RF signal and a second RF signal. The power splitter 105 may be a lossy power splitter, such as a resistive power divider (RPD) or a lower loss Wilkinson power divider (WPD) (also known as a coax power splitter), for example. The RPD may be a Y-model or a Delta model using 3 resistors, and typically has about 6 dB loss and isolation. In comparison, the WPD typically has 3 dB loss and very good isolation (about 20 dB). The power splitter 105 introduces differential noise d(t) into each of the first RF signal and the second RF signal due to the cross-correlation, represented as differential noise source 107. The differential noise d(t) mathematically reduces effective thermal noise, which subtracts from the common mode noise c(t), and thus may be referred to as anti-correlated noise. The differential noise d(t) leads to incorrect MDEVM computations, if not corrected. In addition, the power splitter 105 has relatively low isolation between the two outputs (e.g., about 6 dB isolation for an RPD), which contributes partly to first and second leakage noise hn1(t) and hn2(t) between the first and second channels 110 about 120, discussed below, where "h" is the leakage factor.

Figure 2:
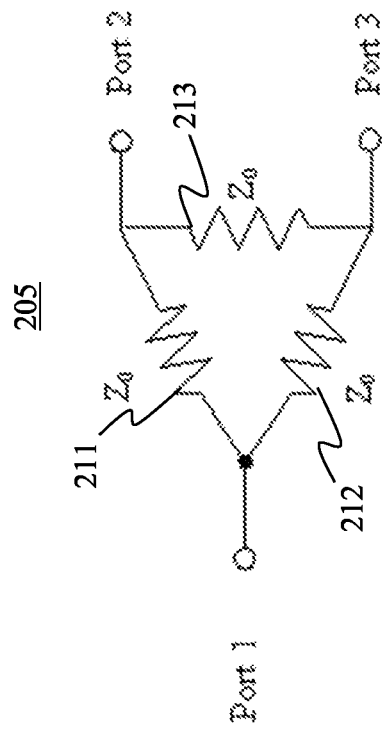
FIG. 2 is a simplified circuit diagram of a power splitter, according to a representative embodiment.

FIG. 2 is a simplified circuit diagram of a power splitter, according to a representative embodiment. Referring to FIG. 2, power splitter 205 is a Delta model RPD, which includes input port 1, first output port 2, and second output port 3. First impedance 211 is connected between the input port 1 and the first output port 2, second impedance 212 is connected between the input port 1 and the first output port 2, and third (shunt) impedance 213 is connected between the first output port 2 and the second output port 3. The first output port 2 is connected to the first channel 110 and the second output port 3 is connected to the second channel 120.

The total correlated noise contributions from the power splitter 205 is attributed to thermal noise, and includes (i)+kT (w/Hz) from a 50 ohms source impedance (not shown) connected to the input port 1, (ii) −kT from the 50 ohms third impedance 213, (iii) 4 kT due to leakage of noise between the first output port 2 and the second output port 3 from 50 ohms termination resistors (not shown) of the first and second channels 110 and 120, respectively, into each other via the power splitter 205 at low frequencies of the RF signal, and (iv) zero for the first and second impedances 211 and 212 (which produce no correlated noise from the cross-correlation), where k is the Boltzmann constant. The low frequencies include RF frequencies up to about 10 MHz for reasonable lengths of RF cables connecting the power splitter to the two receivers. At higher frequencies, the leakage noise becomes undulating, further discussed below.

Total thermal cross-correlation noise is 4 kT for the RPD (instead of the required +kT) based on the sum of the above values at low frequencies. The cross-correlation signal power itself is unchanged. Therefore, at the low frequencies, the net thermal noise power needs to be reduced by 3 kT to compensate for the differential noise d(t).

True MDEVM (E) may be determined by Equation (1), where Ns is average excess noise density of the DUT 101 (source), D is distortion power of DUT, kT is thermal noise from the output 50 ohms resistance of DUT, and Ps average source power density.

$$E = (Ns + D + kT)/Ps \ldots \text{in power ratio} \quad (1)$$

Equation (2) provides measured cross-correlation MDEVM (Em), and Equation (3) provides the error between the measured cross-correlation MDEVM and the true MDEVM.

$$Em = (Ns + D + 4kT)/Ps \quad (2)$$

$$\text{Error} = Em - E = 3kT/Ps \quad (3)$$

Stated differently, true MDEVM is equal to the measured cross-correlation MDEVM minus 3 kT/Ps. The EVMs are power ratios, so 10*log 10(E) provides the true MDEVM in dB.

Referring again to FIG. 1, the first and second RF signals output by the power splitter 105 are input to the first channel 110 and the second channel 120, respectively, which are substantially the same. The first channel 110 includes first power amplifier (PA) 112 for amplifying the first RF signal, first attenuator 114 for attenuating the first RF signal, and first analog to digital converter (ADC) 116 for digitizing the amplified and attenuated first RF signal to provide a digitized first RF signal x1(t). The second channel 120 includes second power amplifier 122 for amplifying the second RF signal, second attenuator 124 for attenuating the second RF signal, and second ADC 126 for digitizing the amplified and attenuated second RF signal to provide a digitized second RF signal x2(t). The first channel 110 introduces uncorrelated first channel noise n1(t) to the first RF signal, represented as first channel equivalent noise source 118, and the second channel 120 introduces uncorrelated second channel noise n2(t) to the second RF signal, represented as second channel equivalent noise source 128. Neither the first channel 110 nor the second channel 120 includes a demodulator because the test system 100 is configured to perform waveform level MDEVM computations using modulated first and second RF signals. The MD error vector and cross-correlated MDEVM computations may be performed in either the time domain or the frequency domain, as mentioned above.

In addition, noise leakage occurs from the first channel 110 into and second channel 120, and vice versa, through the power splitter 105. The leakage noise includes first leakage noise hn1(t) caused by a portion of the first channel noise n1(t) leaking from the first channel 110 to the second channel 120, and second leakage noise hn2(t) caused by a portion of the second channel noise n2(t) leaking from the second channel 120 to the first channel 110, where "h" is the leakage factor. The first and second leakage noise hn1(t) and hn2(t) include leakage between the signal portions of the first and second channels 110 and 120, as well as leakage within the power splitter 105. Because the first and second leakage noise hn1(t) and hn2(t) are in the second channel 120 and the first channel 110, respectively, they are correlated to the first and second channel noise n1(t) and n2(t) in the first and second channels, respectively, and thus create an irreducible noise floor. At higher frequencies of the RF signal, phase shifting occurs in opposite directions, canceling out imaginary parts of the of the first and second leakage noise hn1(t) and hn2(t). This causes oscillation of the first and second leakage noise hn1(t) and hn2(t) between the positive real axis and the negative real axis, creating undulation in the frequency response of the noise floor. This may be addressed by including an isolator in each of the first and second channels 110 and 120, as discussed further below. Also, using a WPD as the power splitter 105 instead of an RPD provides an increase in isolation between the first and second channels 110 and 120 of about 14 dB, as mentioned above, thereby reducing the leakage factor h.

The digitized first RF signal x1(t) and the digitized second RF signal x2(t) are input to processing unit 130 for measuring the respective MDEVMs and performing cross-correlation of the MDEVM measurements. The processing unit 130 may be a digital signal processor (DSP), for example, although other types of processors may be incorporated, as discussed below with reference to FIG. 7, without departing from the scope of the present teachings. The digitized first and second RF signals x1(t) and x2(t) include correlated noise common to both channels and uncorrelated noise specific to the individual channels, as discussed above, and are represented by Equations (4) and (5), respectively, in the time domain.

$$x1(t) = x(t) + c(t) + d(t) + n1(t) + hn2(t) \qquad (4)$$

$$x2(t) = x(t) + c(t) + d(t) + hn1(t) + n2(t) \qquad (5)$$

As discussed above, x(t) is the RF signal (ideal signal), c(t) is the common mode noise i.e., the noise of the DUT, d(t) is the differential (anti-correlated) noise, n1(t) is the first channel noise generated in the first channel 110, hn2(t) is the part of the leakage noise from the second channel 120 leaking into the first channel 110, n2(t) is the second channel noise generated in the second channel 120, and hn1(t) is the part of the leakage noise from the first channel 110 leaking into the second channel 120.

In the frequency domain, the digitized first and second RF signals X1(f) and X2(f) are represented by Equations (6) and (7), respectively.

$$X1(f) = X(f)e^{j\theta x1} + C(f)e^{j\theta c1} + D(f)e^{j\theta d1} + N1(f) + hN2(f)e^{j\theta n} \qquad (6)$$

$$X2(f) = X(f)e^{j\theta x2} + C(f)e^{j\theta c2} + D(f)e^{j\theta d2} + hN1(f)e^{j\theta n} + N2(f) \qquad (7)$$

As discussed above, X is the RF signal (ideal signal), C is the common mode (source) noise, D is the differential (anti-correlated) noise, N1 is the first channel noise of the first channel 110, hN2(t) is the part of the leakage noise from the second channel 120 leaking into the first channel 110, N2 is the second channel noise of the second channel 120, and hN1 is the part of the leakage noise from the first channel 110 leaking into the second channel 120. Also, each exponent term is the phase shift of the associated term with which it is multiplied. For example, $e^{j\theta x1}$ is the phase shift of the X-term of channel-1, which are derived from the frequency response of channel 1, and $e^{j\theta x2}$ is the phase shift of the X-term of channel-2, which are derived from the frequency response of channel 2.

The first and second RF signals may be acquired in the frequency domain (e.g., when the test system 100 is a VNA), or the first and second RF signals may be acquired in the time domain (e.g., when the test system 100 is a digital oscilloscope) and converted to the frequency domain using a fast Fourier transform (FFT), for example, applied by the processing unit 130.

The processing unit 130 includes first equalizer 131 for performing complex equalization of the digitized first RF signal x1(t) (or X1(f)) following time alignment and phase alignment of the first RF signal, and first MD module 132 for calculating the first MDEVM from the equalized first RF signal. The processing unit 130 further includes second equalizer 133 for performing complex equalization of the digitized second RF signal x2(t) (or X2(f)) following time alignment and phase alignment of the second RF signal, and second MD model 134 for calculating the second MDEVM from the equalized second RF signal. The time alignment includes time aligning symbols and packets of each of the digitized first and second RF signals with corresponding symbols and packets of the ideal signal corresponding to the RF signal, and the phase alignment includes de-rotating phases of the digitized first and second RF signals relative to the phase of the ideal signal. Complex equalization is performed in order to refer each of the digitized first and second RF signals to the ideal signal (ideal waveform), and subsequently to refer error vectors respectively associated with the digitized first and second RF signals to the ideal signal. The ideal signal may be a noiseless digital equivalent of signal input to the DUT 101 to produce the response signal as the RF signal, or may be the noiseless digital waveform signal converted to RF signal as output by the DUT 101 when the DUT 101 is the signal generator. The complex equalization may be performed by dividing each of the digitized first and second RF signals by the frequency response of the test system 100, for example. The frequency response is determined based on knowledge of the ideal signal and by applying a Weiner estimation filter. The Weiner estimation filter minimizes the equalizer error in presence of noise and distortion. A Least Squares method can be used instead of the Wiener estimation filter. The equalization also may be computed in the time-domain using a Yule-Walker filter, for example, which is equivalent to the Least Squares method using a Toeplitz matrix. The equalization also equalizes for the frequency response of the DUT 101 as it is referred to the ideal waveform, which is defined digitally or analytically. The process for measuring the first and second MDEVMs by the first and second MD modules 132 and 134 is described further with reference to FIG. 6, below. In the time domain, the first and second error vectors of MDEVM measurements are output by the first and second MD modules 132 and 134, and may be represented as dm1(t) and dm2(t), respectively. In the frequency domain, the first and second error vectors of MDEVM measurements the first and second MD modules 132 and 134 may be represented as DM1(f) and DM2(f), respectively. The measured waveform of each channel must be time-aligned and phase aligned to the reference waveform (ideal waveform) and equalized before the error vectors are extracted in each channel, prior to performing cross-correlation.

In an embodiment, the processing unit 130 may also perform coherent averaging of samples of the digitized first RF signal in the first channel 110 prior to the first MD module 132 measuring the first modulation distortion, and coherent averaging of samples of the digitized second RF signal in the second channel 120 prior to the second MD module 134 measuring the second modulation distortion. The coherent averaging of the respective samples may be performed before or after equalization. Subsequent cross-correlation of the first and second error vectors will then provide only the distortion component of the RF signal. By extracting the noise relative to the coherently averaged waveforms, the noise component of the cross-correlated MD error vectors may be computed. The coherent averaging removes common mode noise c(t) introduced by the DUT 101 and reduces the first and second channel noise n1(t) and n2(t) occurring in the first and second channels 110 and 120 in the cross-correlated MDEVMs, thereby improving processing gain by about P=10*log 10(N) dB, where N is the number of coherent averages. Alternatively, the coherent averaging may be performed on the MD error vectors output by the first and second MD modules 132 and 134.

The processing unit 130 further includes cross-correlation module 135 for performing cross-correlation of the first and second MD error vectors output by the first and second MD modules 132 and 134 in the time domain or for performing cross-spectrum of the first and second MD error vectors output by the first and second MD modules 132 and 134 in the frequency domain, and averaging the cross-correlated results over symbols and packets of the RF signal. Both cross-correlation and cross-spectrum may be referred to herein as "cross-correlation" for the sake of convenience. Cross-correlation is done in the time domain using convolution, while cross-spectrum is performed in the frequency-domain by multiplying the first MD error vectors by the conjugate of the second MD error vectors, or vice versa. While the MD error vectors may be obtained in either the time domain or the frequency domain, the cross-correlation can be done just in the frequency domain using cross-spectrum. In this case, the FFT is taken for the time domain MD error vectors.

The cross-correlation module 135 is further configured to divide the averaged cross-correlated MD error vectors by signal power (amplitude) of the ideal signal to obtain cross-correlated MDEVMs over a time period or bandwidth of a waveform of the RF signal. In an embodiment, the cross-correlated MDEVMs may be further averaged over the time period or the bandwidth of the waveform to obtain an aggregate cross-correlated MDEVM for each symbol, for each packet, or for all packets. The cross-correlated MDEVM is output by the cross-correlation module 135 as the uncorrelated error corrected EVM of the RF signal output by the DUT 101.

In conventional determination of MDEVM in the frequency-domain, the error vectors may be indicated as D(f) when output referred, or D(f)/G$_{ls}$(f), or D'(f), when input referred. The MDEVM is given by Equations (8) and (9) by dividing the input referred error vector by the RF signal in frequency domain.

$$EVM(f) = (D(f)/G_{ls}(f))/X(f) \tag{8}$$

$$EVM = \text{rms}(D(f)/G_{ls}(f))/\text{rms}(X(f)) \tag{9}$$

Notably, the equalization is 1/G$_{ls}$(f) is obtained using cross-spectrum S$_{xy}$ of ideal input x and DUT output y and then dividing by the ideal input signal power spectral density S$_{xx}$. (This is the Weiner estimation filter.) S$_{xy}$(f)=X(f)*(conj (Y(f))), and S$_{xx}$(f)=X(f)*conj(X(f)).

In the representative embodiments described herein, the D'(f) terms of the first and second channels 110 and 120 are cross-correlated. That is, Dd(f)=D1'(f)*conj(D2'(f)). Using S$_{xx}$(f)=X(f)*conj(X(f)), where X(f) is the Fourier transform of the ideal signal, the cross-correlated MDEVM (ccMDEVM) is provided by Equations (10) and (11).

$$ccMDEVM(f) = \sqrt{\left|\text{mean over symbols and packets}\left(\frac{Dd(f)}{Sxx(f)}\right)\right|} \tag{10}$$

$$ccMDEVM = \sqrt{\text{mean over frequency }(ccMDEVM(f))^2} \tag{11}$$

In the frequency domain, the cross-correlation module 135 calculates cross-correlated signal S$_{x1x2}$(f), which compensates for errors produced by frequency independent (static) noise and frequency dependent noise. The frequency independent noise term is anti-correlated and arises from the differential noise d(t) introduced by the power splitter 105, e.g., from an internal shunt resistor between the first and second channels 110, discussed above. When left uncorrected, this anti-correlated noise would subtract out kT (Watts/Hz) amount of thermal noise from the source (correlated) noise of the DUT 101 during the cross-correlation based MDEVM computation, discussed below, leading to incorrect MDEVM measurement results that are lower than the physical bound of the thermal noise to signal ratio. (The existence of this phenomenon was not known for conventional cross-correlation measurements using demodulation.) The 50 ohms or 100 ohms differential shunt resistor is present in the RPD and the WPD, respectively, leading to a subtraction of kT (watts/Hz) noise from the source noise during the cross-correlation computation as it produces anti-correlated noise. For example, measurements done at −50 dBm source power for a WLAN 802.11BE signal with 320 MHz modulation bandwidth showed a cross-correlated MDEVM measurement of −45 dB, while the thermal noise to signal ratio was −39 dB in the same bandwidth after correcting for kT error, as discussed herein, which is the theoretical lower limit of EVM measurements.

The frequency dependent noise term is due to leakage of noise from the first channel 110 into the second channel 120 and vice versa, and produces an irreducible noise floor with peaks that cannot be penetrated (reduced) by increasing the number of cross-correlations even by a large amount. This first and second leakage noise are hn1(t) and hn2(t) and originate from first and second channel noise n1(t) and n2(t) in FIG. 1, where h is the leakage factor. The frequency dependent noise term has peaks and nulls over frequency, producing undulation in the total system noise floor, thereby producing undulation in the cross-correlated MDEVM measurements over subcarrier frequency. Peaks in the frequency dependent noise term occur when the leaked noise is in phase with the original first and second channel noise n1(t) and n2(t), while nulls occur when the frequency dependent noise term is 180 degrees out of phase with the original noise. At the frequency nulls, anti-correlated noise is produced, subtracting from the source noise, which is a similar effect caused by the differential noise d(t). The frequency dependent undulation in the total system noise floor is mitigated by techniques discussed below, particularly for RPD where the undulations manifest more strongly due to poorer isolation between its output ports.

The theoretical explanation is in the equations below. In the frequency domain, the cross-correlation (cross-spectrum) $S_{x1x2}$ is determined by multiplying the first RF signals X1 by the conjugate of the second RF signal X2, or vice versa, as show in Equation (12), which is expanded in Equation (13). In actual implementation XX* is computed for the signal power using the "ideal" signal. The remaining terms of Equation (12) belong to the cross-spectrum of the error vectors of the first and second channels 110 and 120. The error vectors are extracted from the difference of the ideal signal and the equalized signal for each channel.

$$S_{x1x2}(f) = X1 \cdot X2^* \qquad (12)$$

$$S_{x1x2}(f) = XX^* e^{j\Delta\theta x} + [CC^* e^{j\Delta\theta c} - DD^* e^{j\Delta\theta d} + \qquad (13)$$

$$CC^* e^{j\Delta\theta c} + hN1N1^* e^{-j\Delta\theta cn} + hN2N2^* e^{+j\Delta\theta cn}] + U$$

In Equation (13), $XX^* e^{j\Delta\theta x}$ is power of the RF signal, the bracketed portion is the correlated noise, and U is the uncorrelated noise. $DD^* e^{j\Delta\theta d}$ in particular is anti-correlated noise from the power splitter 105 since it is subtracted. The uncorrelated noise U is shown in Equation (14).

$$U = Xe^{j\theta x1}[Ce^{j\theta c2} - De^{j\theta d2} + hN1e^{j\theta n} + N1]^* + \qquad (14)$$

$$Ce^{j\theta c1}[Xe^{j\theta x2} - De^{j\theta d2} + hN1e^{j\theta n} + N2]^* + \dots$$

Figure 3A:
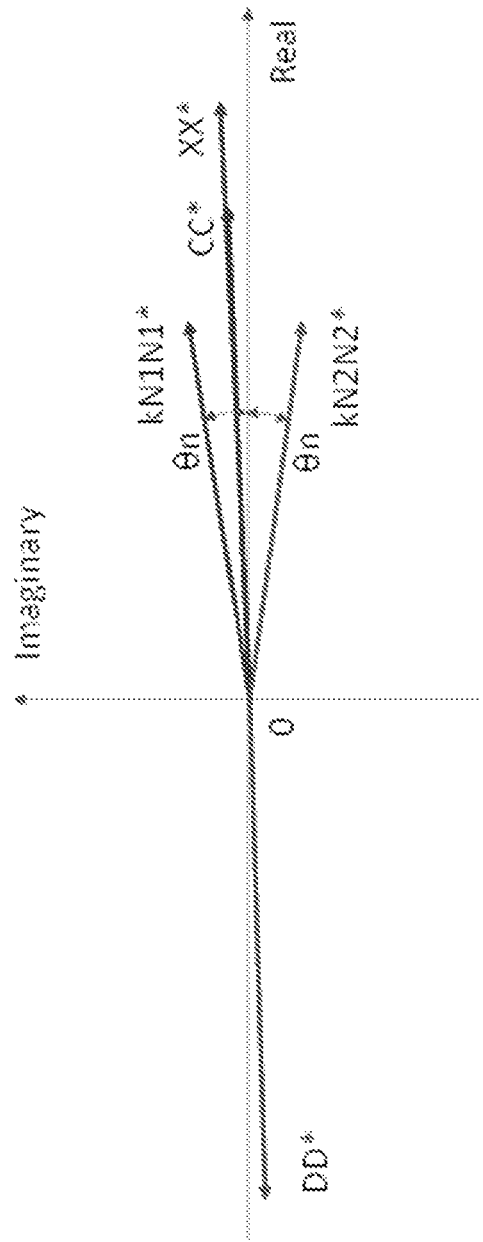
FIG. 3A is a graph showing correlated and anti-correlated terms from random noise of the test system, according to a representative embodiment.

FIG. 3A is a graph showing correlated and anti-correlated terms from random noise of the test system 100, according to a representative embodiment. Referring to FIG. 3A, the vector XX* is the RF signal, and the vector CC* is the common mode noise (noise of DUT), both of which are co-linear (as they originate from the same source, the DUT) and lie substantially along the positive real axis. The small phase shift (e.g., about 1 degree) is present due to the first and second channels 110 and 120 having slightly different RF cable lengths, e.g., due to manufacturing imperfections. The vector DD* is the anti-correlated noise, which lies substantially along the negative real axis and a small negative phase shift opposite to that of the vector CC*. Therefore, as discussed above, the anti-correlated noise reduces the measured noise, making the MDEVM look better than it actually is if left uncompensated for. The vectors hN1N1* and hN2N2* are the correlated leakage noise physically originating from the first and second channels 110 and 120, respectively, and are further discussed below with reference to FIG. 4. In particular, N1* and hN2 are in the first channel 110 and N2* and hN1 are in the second channel 120. The complex vectors hN1N1* and hN2N2* have opposite phases due to cross-correlation, and the sum of hN1N1* and hN2N2* is the real term of the correlated leakage noise, which fluctuates between positive and negative values (e.g., a sine wave) and creates the irreducible noise floor, mentioned above. They can produce anti-correlated (negative) power when the channel phase shift exceeds 90 degrees.

Figure 3B:
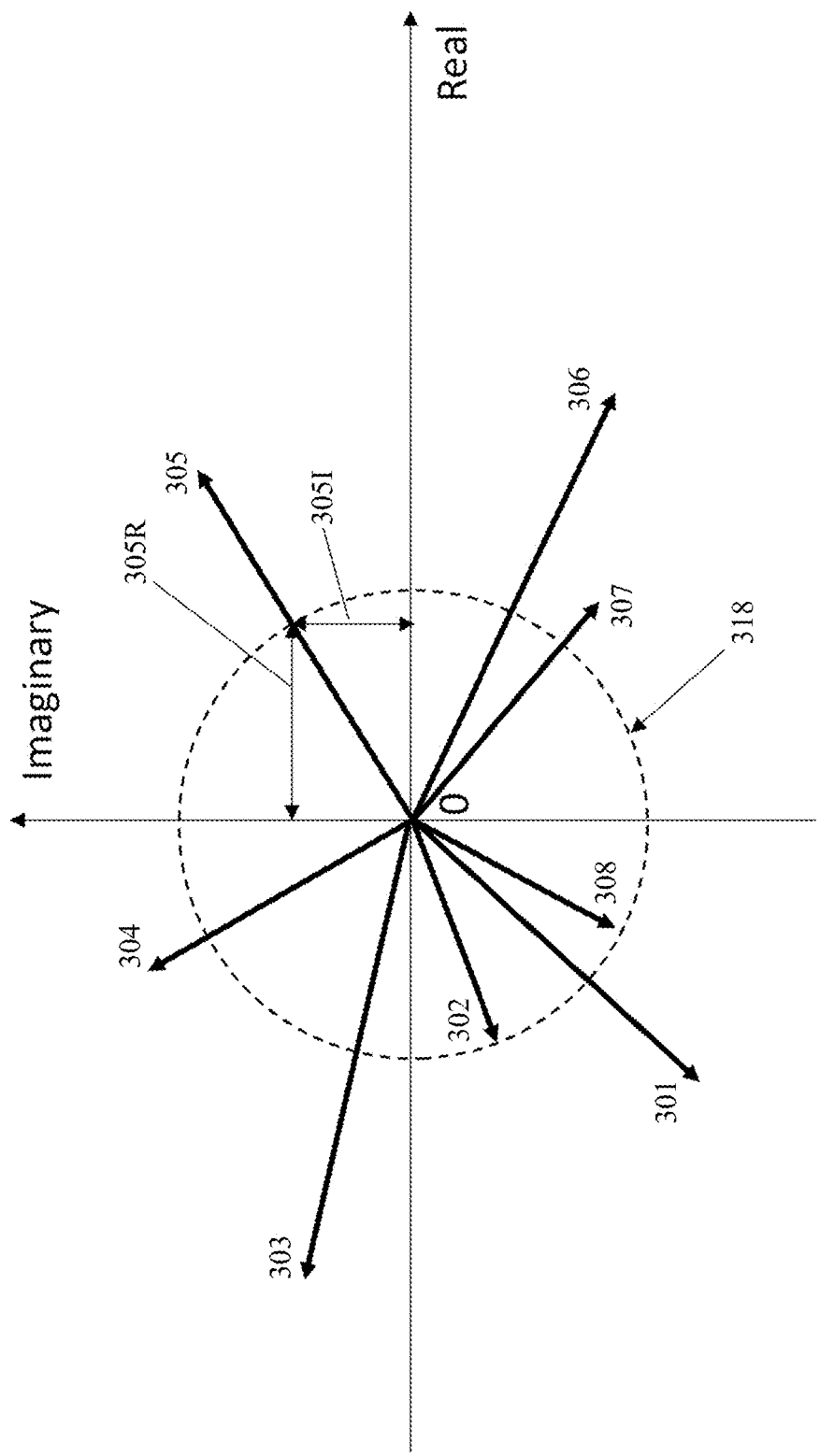
FIG. 3B is a graph showing uncorrelated terms from random noise of the test system, according to a representative embodiment.

FIG. 3B is a graph showing uncorrelated terms from random noise of the test system 100, according to a representative embodiment. Referring to FIG. 3B, the eight vectors 301, 302, 303, 304, 305, 306, 307 and 308 have random magnitudes and phases that arise pair-wise uncorrelated noise voltages. Representative vector 305 has a real component 305R and an imaginary component 305I, where the real component 305R cannot be separated from the RF signal and the common mode noise power and the imaginary component 305I can be separated from the RF signal and the common mode noise power. The circle 318 indicates expected power $P_U$ of uncorrelated noise (U) for a given number of cross-correlations of the MDEVM measurements, provided by Equation (15).

$$P_U = \text{rms(imaginary components)} * \sqrt{2} \qquad (15)$$

Generally, the more cross-correlations that are performed, the lower the expected power $P_U$, such that the noise floor drops at the number of cross-correlations increases. For example, the cross-correlation of the first and second MD error vectors performed by the cross-correlation module 135 may be repeated to reduce the uncorrelated noise. For example, according to Equation (16), the measured noise $N_{meas}$ is determined as the correlated noise in the SUT ($N_{SUT}$) and the first and second uncorrelated noise ($N_1$, $N_2$) from the first and second channels 110 and 120, respectively, as follows:

$$N_{meas} = N_{SUT} + (N_1 + N_2)/\sqrt{M} \qquad (16)$$

In Equation (16), M is the number of cross-correlations performed. As shown in Table 1 below, as the number M increases, the more the uncorrelated noise is reduced.

TABLE 1

| M (number of cross-correlations) | 10 | 100 | 1000 | 10000 |
|---|---|---|---|---|
| N1, N2 (combined noise reduction) | −5 dB | −10 dB | −15 dB | −20 dB |

The M cross-correlated error vectors are averaged over symbols and packets of the RF signal to improve processing gain. Performing the cross-correlation of the first and second MD error vectors and the averaging of the cross-correlated MD error vectors suppress contribution of uncorrelated noise U introduced by the first and second channels to the first and second MD error vectors, respectively. The resulting output is an MD error vector of the RF signal that has suppressed cross-correlated noise, and a reduced noise floor from suppressed leakage noise. Signals from various aspects of the process, including the output of the cross-correlated MD error vector, may be displayed on display 140.

Figure 4:
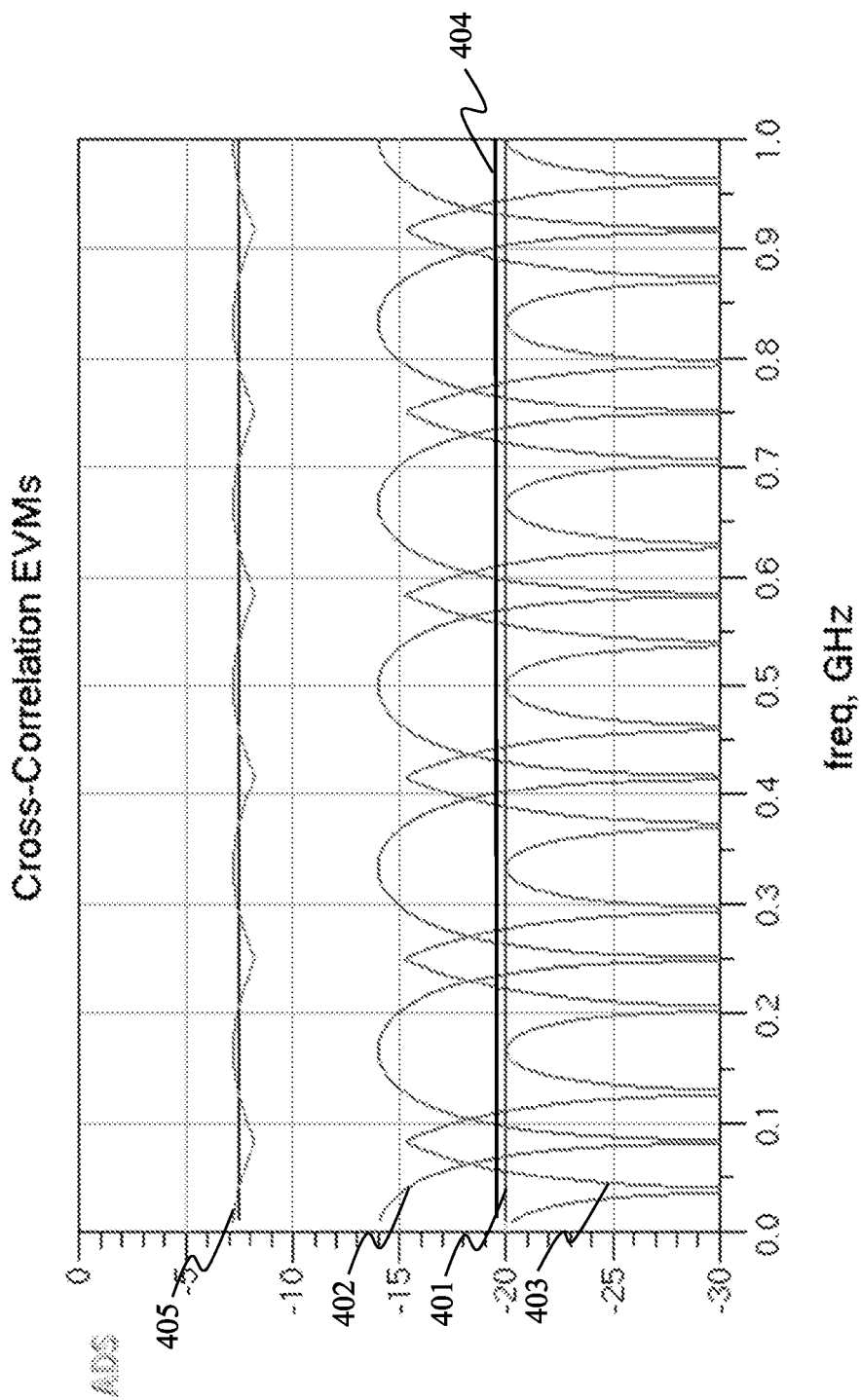
FIG. 4 is a display showing signals from the MDEVM cross-correlation process, including compensation for leakage noise, according to a representative embodiment.

FIG. 4 is a display showing signals from the MDEVM cross-correlation process, including compensation for leakage noise, according to a representative embodiment.

Referring to FIG. 4, the hN1N1* and hN2N2* leakage noise terms from the cross-correlation of Equation (13) produce frequency-varying peaks and nulls about a mean value. Trace 401 shows MDEVM of the DUT 101 at −20 dB attributable to thermal noise. Trace 402 shows the cross-correlated MDEVM without correction of the hN1N1* and hN2N2* leakage noise, and trace 403 shows the cross-correlated MDEVM after correction of −3 kT, according to a representative embodiment, where k is the Boltzmann constant. The correction is done in linear scale while the plot is in dB scale. Notably, correction of differential noise d(t) is +kT when the power splitter 105 is a WPD. When the power splitter 105 is an RPD, however, it produces additional leakage noise cross-correlation and the total required correction turns out to be −3 kT.

At low frequencies (e.g., less than about 10 MHz) and/or very short cable lengths of the first and second channels 110 and 120 (e.g., less than about 1 foot), trace 403 corresponds to trace 401. At higher frequencies and/or longer cable lengths, the peaks in trace 403 that touch trace 401 correspond to a phase shift of K*360 degrees of the first leakage noise hn1(t) leaking from the first channel 110 to the second channel 120, and the second leakage noise hn2(t) leaking from the second channel 120 to the first channel 110, where K is an integer. This leads to correlated noise of each of the first and second leakage noise hn1(t) and hn2(t). The peaks in trace 403 that exceed trace 401 by approximately 5-6 dB correspond to a phase shift of 180 degrees, or odd multiples of 180 degrees, of the first leakage noise hn1(t) leaking from the first channel 110 to the second channel 120, and the second leakage noise hn2(t) leaking from the second channel 120 to the first channel 110. This leads to anti-correlated noise of each of the first and second leakage noise n1(t) and n2(t). The nulls in trace 403 correspond to a phase shift of 90 degrees, or odd multiples of 90 degrees. In this case the hN1N1* and hN2N2* cross correlation terms cancel each other cause they have opposite signs, one being +90 degrees and the other being −90 degrees.

To address the first and second leakage noise hn1(t) and hn2(t), according to an embodiment, the first attenuator 114 or the first power amplifier 112 is placed in series with the input of the first channel 110 and the second attenuator 124 or the second power amplifier 122 is placed in series with the input of the second channel 120, so that the first and second leakage noise hn1(t) and hn2(t) from one channel into the other is suppressed, thereby reducing the effect of the frequency dependent terms. The noise from each of the first and second attenuators 114 and 124 and/or the first and second power amplifiers 112 and 122 are uncorrelated, and are therefore suppressed by the cross-correlation. While the first channel noise n1(t) as shown in FIG. 1 is the total uncorrelated noise of the first channel 110 and includes quantization noise of the first ADC 116, only part of the first channel noise n1(t) that originates in the chain prior to the first ADC 116 actually contributes to the first leakage noise hn1(t) leaking from the first channel 110 to the second channel 120. The first leakage noise hn1(t) is dependent on attenuation from the individual noise sources in the first channel 110 to the output of the power splitter 105 of the other second channel 120. The same is true with regard to the second channel noise n2(t) and the second leakage noise hn2(t).

In another embodiment (with or without the first and second attenuators 114 and 124), a WPD is incorporated as the power splitter 105 instead of an RPD. As discussed above, the WPD provides isolation of about −20 dB between the first and second channels 110 and 120 within the power splitter 105, while an RPD provides isolation of about −6 dB between the first and second channels 110 and 120 within the power splitter 105. The 14 dB increase in isolation by the WPD reduces the effect of the frequency dependent terms. Although the WPD has a narrower bandwidth than an RPD, the WPD may have multiple stages to increase its bandwidth over which it is able maintain good isolation and low insertion loss (close to 3 dB).

In an embodiment using an RPD, which costs much less and has a wider bandwidth than the WPD, calibration may be performed to compensate for the lower isolation provided by the RPD. First, the power splitter 105 is terminated and disconnected from the DUT 101. Second, the noise spectrum of the test system 100 and undulation of the noise floor of the RF signal are measured with the power splitter 105 disconnected from the DUT and terminated. Third, channel frequency response is determined and calibrated in the processing unit 130 to improve the accuracy of the noise spectrum and the undulation.

For example, the undulation in the noise spectrum may be removed by applying a suitable frequency domain correction E2(k) in Watts/B, such that the mean of the cross-correlated MDEVM is preserved and is the same for all the subcarriers, where k is the subcarrier index. The total correction E_new (k) of the cross-correlated MDEVM for a subcarrier index k is then given by Equation (17).

$$E\_new(k) = E\_old(k) + E1(k) + E2(k) \qquad (17)$$

The MDEVM for the kth subcarrier is 10*log 10(E_new (k)) in dB. In Equation (17), E-old(k) is the previous (inadequate) frequency domain correction of the cross-correlated MDEVM, E1(k) is the correction of the anti-correlated differential noise d(t) that is constant over frequency, and E2(k) is the correction for the first and second leakage noise n1(t) and n2(t), part of which leaks to the other channel and creates a frequency varying irreducible noise floor, as discussed above. Simulated results are shown in FIG. 4 for the case in which the power splitter is an RPD and the DUT 101 has −20 dB MDEVM thermal noise.

Taking mean in the power domain of the frequency varying cross-correlated MDEVM results in close approximation to the MDEVM of the DUT 101, as shown by trace 404. That is, trace 403 can be further corrected to produce trace 404, and the corrections can be calibrated and saved for a given setup.

In an embodiment, the equal line lengths of the first and second channels 110 and 120 are adjusted to be even multiples of 360 degrees. In this case, the cross-correlated leakage noise power phases of the hN1N1* and hN2N2* cross-correlation terms are real, resulting in the peaks in trace 403 touching trace 401, resulting in the correct cross-correlated MDEVM. In another embodiment, the equal line lengths of the first and second channels 110 and 120 are adjusted to be odd multiples of 90 degrees. In this case, the cross-correlated leakage noise power phases of the hN1N1* and hN2N2* cross-correlation terms cancel each other, resulting in nulls in trace 403. To get the correct cross-correlated MDEVM, kT/Ps term is added to the power ratio of the cross-correlated MDEVM. Trace 405 shows the cross-correlated MDEVM case for the number of cross-correlations of MD error vectors being only one, where trace 405 is dominated by the first and second channel noise n1 and n2. The MD error vector of each channel is the trace 405 which is determined mostly by n1 and n2 that are not suppressed.

Figure 5:
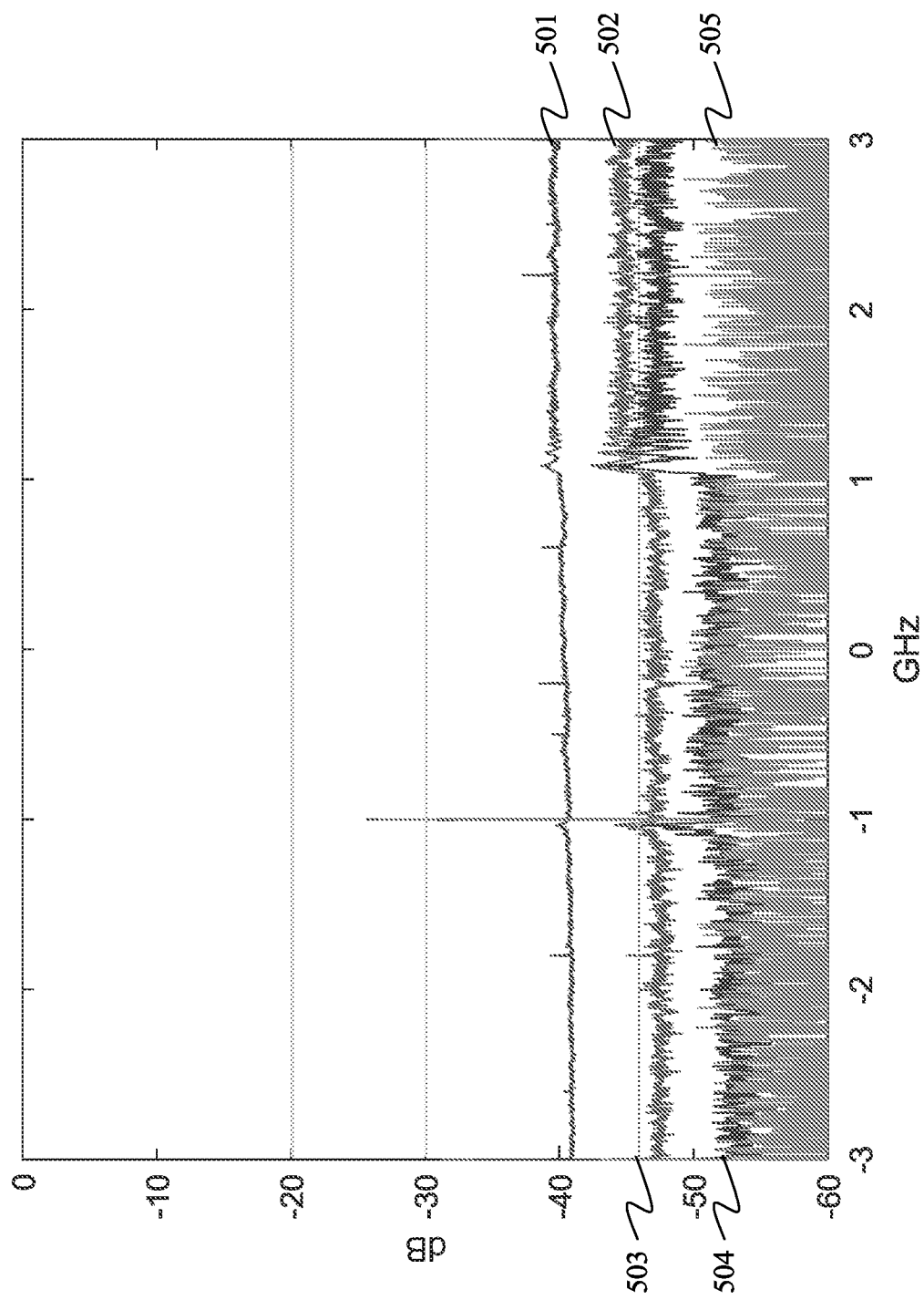
FIG. 5 is a display showing signals from the MDEVM cross-correlation process using actual measurements, according to a representative embodiment.

FIG. 5 is a display showing signals from the MDEVM cross-correlation process using actual measurements, according to a representative embodiment. The displayed signals may be shown, for example, on the display 140.

Referring to FIG. 5, trace 501 is MDEVM measured for one of the first or second RF signals, with no cross-correlation being performed. The MDEVM includes equalization. The MDEVM is noise plus distortion having a power of about −41 dB relative to the signal in this measurement. Trace 502 is equalized and cross-correlated MDEVM, e.g., output by the cross-correlation module 135, having a power of about −47 dB relative to the signal power, which is about 6 dB lower due to the ~5*log 10(N)) improvement over the uncross-correlated MDEVM of trace 501. Trace 503 is the average value of trace 502 over the frequency and is the aggregate cross-correlated MDEVM. Trace 504 is equalized and cross-correlated MDEVM following coherent averaging of the MD error vectors prior to cross-correlation, having a power of about −52 dB, which is an 11 dB (~10*log 10(N)) improvement over the uncross-correlated MDEVM of trace 501. The coherent averaging also suppresses the common mode noise introduced by the DUT 101. Trace 505 is the noise floor, which is at about −54 dB. As mentioned above, the noise floor drops as the number of cross-correlations of the MD error vectors increases. The noise floor is extracted using the imaginary component of the MD cross-correlated error vectors.

Figure 6:
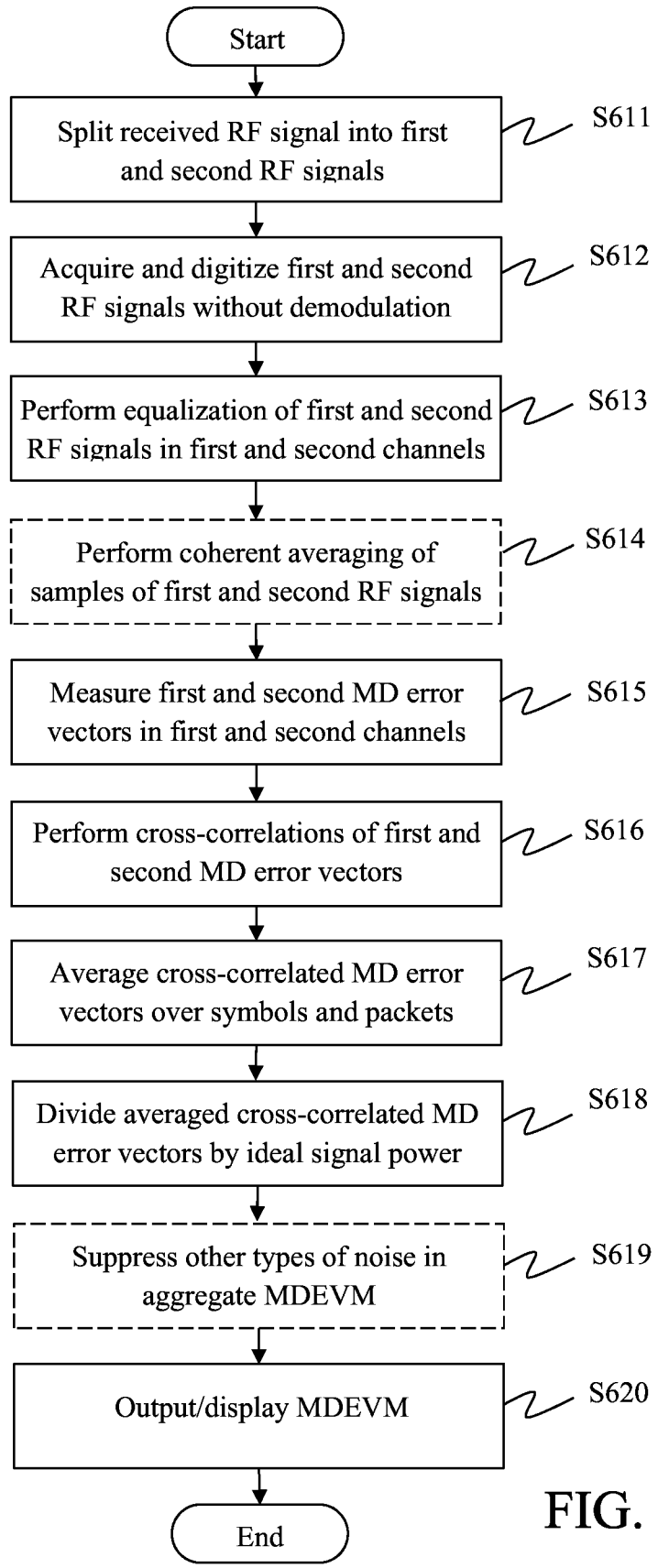
FIG. 6 is a flow diagram illustrating a method of measuring MDEVM of a DUT using cross-correlation, according to a representative embodiment.

FIG. 6 is a flow diagram illustrating a method of measuring MDEVM of a DUT based on cross-correlation, according to a representative embodiment. The method may be implemented by the processing unit 130, for example, where the method steps are provided as instructions stored in memory and executable by one or more processors.

Referring to FIG. 6, an RF signal or SUT output by the DUT (e.g., DUT 101) is split into a first RF signal and a second RF signal using a power splitter (e.g., power splitter 105) in block S611. The RF signal may be generated by the DUT when the DUT itself is a signal source, or may be output by the DUT in response to a stimulus signal input to the DUT by a separate signal source. The DUT introduces common mode noise c(t) in the RF signal, where the common mode noise is correlated noise in that it is the same in both the first and second RF signals. The splitter introduces differential noise d(t) in both the first and second RF signals. The differential noise d(t) is anti-correlated in that it appears in both the first and second RF signals and subtracts from actual noise.

In block S612, the first RF signal is acquired and digitized in a first channel (e.g., first channel 110) and the second RF signal is acquired and digitized in a second channel (e.g., second channel 120) without demodulation of either of the first or second RF signals. The first and second channels are independent, and introduce uncorrelated channel noise (n1 and n2) to the first and second RF signals, respectively. The first channel also introduces first leakage noise hn1(t) in the second channel, and the second channel also introduces second leakage noise hn2(t) in the first channel. The first and second leakage noise hn1(t) and hn2(t) include leakage noise introduced across the first and second channels and leakage noise introduced within the power splitter. The first and second leakage noise hn1(t) and hn2(t) are uncorrelated.

The symbols and packets of the digitized RF signal are also time aligned with corresponding symbols and packets of an ideal signal corresponding to the RF signal. Also, a phase of the RF signal is de-rotated for phase alignment relative to the phase of the ideal signal. When the DUT is the signal source, the ideal signal is the digital waveform. When the DUT outputs the RF signal in response to a stimulus signal from the actual signal source, the ideal signal is the digital waveform of the stimulus signal or a digitized version of the stimulus signal using a high quality digitizer having an EVM is much better than that of the DUT. Examples of high quality digitizers include UXA, UXR and M8131A digitizers available from Keysight Technologies, Inc.

In block S613, equalization is performed on the digitized first RF signal in the first channel and of the digitized second RF signal in the second channel, following time alignment and phase alignment of the digitized first and second RF signals, respectively. The equalization refers each of the digitized first RF signal and the digitized second RF signal to an ideal signal, which is the digital waveform for RF signal output by the DUT when the DUT is the signal source, or the measured (digitized) or digital waveform of stimulus signal input to the DUT when there is signal source other than the DUT.

Equalization may be performed by applying a complex equalization filter to each of the digitized first and second RF signals, which includes determining filter coefficients that minimize a mean square error of the distortion signals, discussed below. Various types of known complex equalization filters may be applied, without departing from the scope of the present teachings. For example, the complex equalization filter may be a Yule-Walker filter, in which case determining the filter coefficients may include solving a matrix equation b=(T−1*v), where v is cross-correlation vector of the symbols, where T is a Toeplitz matrix of an autocorrelation vector of the symbols, and where b is a vector including the filter coefficients of the complex equalization filter. Solving the matrix equation b=(T−1*v) may include determining T−1 from the Toeplitz matrix T by applying a Levinson-Durbin algorithm. Alternatively, the complex equalization filter may be a least squares filter, in which case determining the filter coefficients may include by solving a matrix equation of the form b=(RH*R)−1*RH*x, where x is a vector of the symbols, R is a matrix of the symbols with each column in R is a one-clock increased delayed version of the immediately previous column, where H indicates the Hermitian operation, and where b is a vector including the filter coefficients of the least squares filter. Equalization can be done in frequency domain using Weiner estimation filter where the equalization frequency response is given by H(f)=Sxy/Sxx. Here, Sxy is the cross-spectrum of x (ideal signal) and y (DUT output), and Sxx is the power spectrum of the ideal signal.

In block S614, coherent averaging is optionally performed on samples of the equalized first RF signal in the first channel and on samples of the equalized second RF signal in the second channel. The coherent averaging suppresses the common mode noise c(t) introduced by the DUT and at least a portion of the first and second leakage noise hn1(t) and hn2(t)) occurring between the first and second channels. "Suppressing" noise (e.g., common mode noise, leakage noise) means reducing and/or eliminating the noise. In an embodiment, the coherent averaging may be performed prior to equalization in each of the first and second channels, without departing from the scope of the present teachings.

In block S615, first MD error vectors of the equalized first RF signal are measured in the first channel and second MD error vectors of the equalized second RF signal are measured in the second channel. The first and second MD error vectors are measured by a DSP or other processing unit. The process of measuring the first and second MD error vectors differs depending on whether the equalized first and second RF signals are in the time domain or the frequency domain.

In the time domain, measuring the first MD error vectors includes determining a distortion signal (which includes the noise) of the first RF signal by subtracting time samples of the equalized first signal from corresponding aligned time samples of the ideal signal, as would be apparent to one skilled in the art. Additional description of measuring MD error vectors in the time domain is provided, for example, in U.S. Pat. No. 11,595,137 B1 to Mohindra, issued Feb. 28, 2023, which is incorporated herein by reference in its entirety. Measuring the second MD error vectors is the same using the equalized second RF signal.

In the frequency domain, measuring the first MD error vectors includes subtracting the frequency domain samples of the equalized first RF signal from the corresponding frequency domain points of the ideal signal, as would be apparent to one skilled in the art. The processing may be performed in the frequency domain by taking the FFT of time domain MD error vectors from each of the first and second channels. Additional description of measuring MD error vectors in the frequency domain is also provided, for example, in U.S. Pat. No. 11,595,137 B1, which is incorporated herein by reference in its entirety. Measuring the second MD error vectors is the same using the equalized second RF signal.

Referring again to FIG. 6, in block S616, cross-correlations of the first and second MD error vectors are performed across the first and second channels to provide cross-correlated MD error vectors of the RF signal output by the DUT. The cross-correlations may be performed by multiplying the first MD error vectors from the first channel by the complex conjugates of the second MD error vectors from the second channel, or vice versa.

In block S617, the cross-correlated MD error vectors are averaged over both symbols and packets of the RF signal to improve processing gain. Averaging over symbols means averaging over the samples (time or frequency points) of a packet or waveform. Averaging over packets means averaging over time of aggregate from each packet. The averaging can be done only over packets for each time or frequency point within a packet. In this case, the MDEVM is computed over frequency or over the waveform time duration Performing the cross-correlation of the first and second MD error vectors and averaging the cross-correlated MD error vectors suppress contribution of uncorrelated noise introduced by the first and second channels to the first and second MD error vectors, respectively. As discussed above, the larger the number of cross-correlated and averaged MD error vectors, the greater the noise reduction.

In block S618, the averaged cross-correlated MD error vectors are divided by signal power (amplitude) of the ideal signal to obtain cross-correlated MDEVMs over a time period or bandwidth of a waveform of the RF signal, discussed above. Generally, each of the cross-correlated MDEVMs is determined by dividing a root mean square of the cross-correlated MD error vectors by a root mean square of the RF signal. In an embodiment, the cross-correlated MDEVMs may be averaged over the time period or the bandwidth of the waveform to obtain an aggregate cross-correlated MDEVM for each symbol, for each packet, or for all packets.

In block S619, one or more of the other types of noise introduced to the RF signal and/or to the first and second RF signals are optionally suppressed in the cross-correlated MDEVM. Suppressing other types of noise may include suppressing the anti-correlated differential noise d(t) introduced by the power splitter. For example, a predetermined amount of thermal noise may be added to the cross-correlated MDEVM in order to suppress (cancel) the differential noise d(t). For example, the predetermined amount of thermal noise may be kT watts per Hz, which is added to cancel the differential noise d(t) introduced by a WPD, or −3 kT watts per Hz, which may be added to cancel the differential noise d(t) introduced by an RDP.

Suppressing other types of noise may also include suppressing the first and second leakage noise hn1(t) and hn2(t). Suppressing the first and second leakage noise hn1(t) and hn2(t) in the power splitter may be accomplished by initially incorporating a power splitter with higher isolation between the first and second channels. For example, a WPD provides 20 dB of channel isolation, while an RPD provide only 6 dB of channel isolation. Alternatively, or in addition, an attenuator may be added before the input to each of the first and second channels and/or an isolator (e.g., an isolator amplifier) may be added to each of the first and second channels.

Also, as discussed above, phase shifting of the first and second leakage noise hn1(t) and hn2(t) occurs in opposite directions at higher frequencies, which causes oscillation of the first and second leakage noise hn1(t) and hn2(t) between the positive real axis and the negative real axis, creating undulation in the frequency response of the noise floor. Therefore, suppressing the first and second leakage noise hn1(t) and hn2(t) may further include measuring noise spectrum and undulation of the RF signal noise floor with the power splitter disconnected from the DUT and terminated, and calibrating the processing unit 130 to determine a frequency domain correction that improves accuracy of the noise spectrum and the undulation. Then, with the power splitter reconnected with the DUT, the frequency domain correction may be applied to the cross-correlation of the first and second MD error vectors to remove the undulation from the noise spectrum, while preserving the mean of the noise spectrum.

In block S620, the cross-correlated MDEVMs of the RF signal are output, and may be displayed, e.g., on the display 140. Examples of displayed traces, including cross-correlated MDEVMs, are shown in FIG. 4, discussed above.

Figure 7:
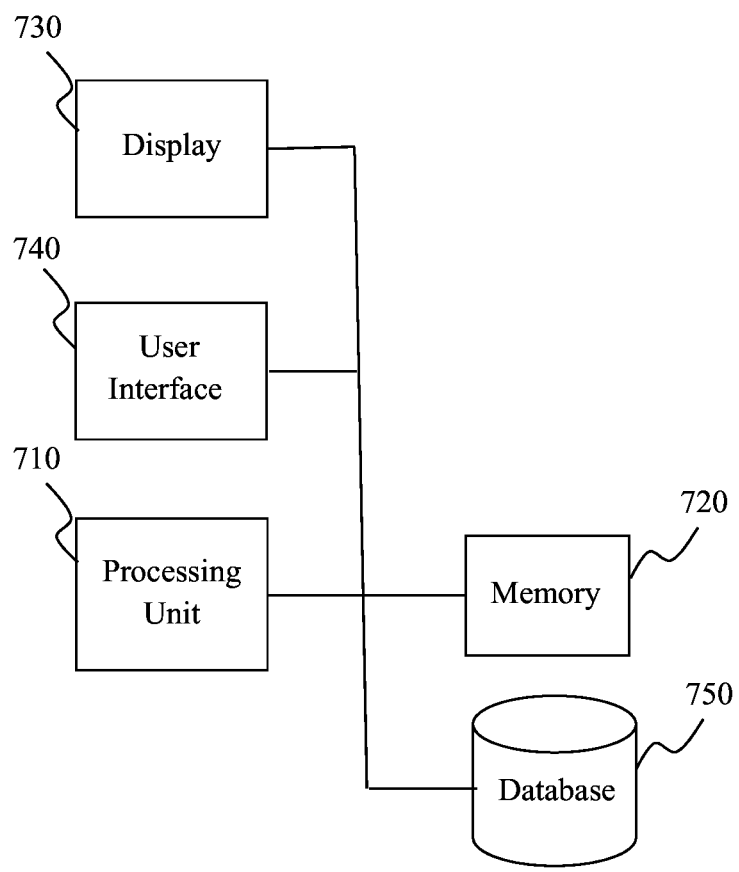
FIG. 7 is a simplified block diagram of a representative processing unit, according to a representative embodiment.

FIG. 7 is a simplified block diagram of a representative processor unit, such as the processing unit 130 in FIG. 1, according to a representative embodiment.

Referring to FIG. 7, processing unit 130 includes a processor 710, memory 720 for storing instructions executable by the processor 710 to implement the processes described herein, as well as a display 730 and an interface 740 to enable user interaction. The processor 710 may also access a database 750 that stores information to be used for testing, for example.

The processor 710 is representative of one or more processing devices, and is configured to execute software instructions to perform functions as described in the various embodiments herein. The processor 710 may be implemented by a general purpose computer, a central processing unit, one or more processors, microprocessors or microcontrollers, a state machine, a programmable logic device, field programmable gate arrays (FPGAs), application specific integrated circuits (ASICs), or combinations thereof, using any combination of hardware, software, firmware, hardwired logic circuits, or combinations thereof. The term "processor" encompasses an electronic component able to execute a program or machine executable instructions. References to a processor should be interpreted to include more than one processor or processing core, as in a multi-core processor, and/or parallel processors. Programs have software instructions performed by one or multiple processors that may be within the same computing device or which may be distributed across multiple computing devices.

The memory 720 may include a main memory and/or a static memory, where such memories may communicate with each other and the processor 710 via one or more buses. The memory 720 stores instructions used to implement some or all aspects of methods and processes described herein, including the methods described above with reference to FIG. 7, for example.

The memory 720 may be implemented by any number, type and combination of random access memory (RAM) and read-only memory (ROM), for example, and may store various types of information, such as software algorithms, data based models including neural network based models, and computer programs, all of which are executable by the processor 710. The various types of ROM and RAM may include any number, type and combination of computer readable storage media, such as a disk drive, flash memory, an electrically programmable read-only memory (EPROM), an electrically erasable and programmable read only memory (EEPROM), registers, a hard disk, a removable disk, tape, compact disk read only memory (CD-ROM), digital versatile disk (DVD), floppy disk, blu-ray disk, a universal serial bus (USB) drive, or any other form of storage medium known in the art.

The memory 720 is a tangible storage medium for storing data and executable software instructions, and is non-transitory during the time software instructions are stored therein. As used herein, the term "non-transitory" is to be interpreted not as an eternal characteristic of a state, but as a characteristic of a state that will last for a period. The term non-transitory specifically disavows fleeting characteristics such as characteristics of a carrier wave or signal or other forms that exist only transitorily in any place at any time. The memory 720 may store software instructions and/or computer readable code that enable performance of various functions. The memory 720 may be secure and/or encrypted, or unsecure and/or unencrypted.

Similarly, the database 750 may be implemented by any number, type and combination of RAM and ROM, for example, discussed above, The database 750 likewise is a tangible storage medium for storing data and executable software instructions, and is non-transitory during the time software instructions are stored therein. The database 750 may be secure and/or encrypted, or unsecure and/or unencrypted.

"Memory" is an example of computer-readable storage media, and should be interpreted as possibly being multiple memories or databases. The memory or database may for instance be multiple memories or databases local to the computer, and/or distributed amongst multiple computer systems or computing devices. A computer readable storage medium is defined to be any medium that constitutes patentable subject matter under 35 U.S.C. § 101 and excludes any medium that does not constitute patentable subject matter under 35 U.S.C. § 101. Examples of such media include non-transitory media such as computer memory devices that store information in a format that is readable by a computer or data processing system. More specific examples of non-transitory media include computer disks and non-volatile memories.

The display 730 may be a monitor such as a computer monitor, a television, a liquid crystal display (LCD), an organic light emitting diode (OLED), a flat panel display, a solid-state display, or a cathode ray tube (CRT) display, or an electronic whiteboard, for example. The display 730 may also provide a graphical user interface (GUI) for displaying and receiving information to and from the user. The display 140 in FIG. 1 may be implemented as the display 730.

The interface 740 may include a user and/or network interface for providing information and data output by the processor 710 and/or the memory 720 to the user and/or for receiving information and data input by the user. That is, the interface 740 enables the user to enter data and to control or manipulate aspects of the processes described herein, and also enables the processor 710 to indicate the effects of the user's control or manipulation. The interface 740 may connect one or more user interfaces, such as a mouse, a keyboard, a mouse, a trackball, a joystick, a haptic device, a microphone, a video camera, a touchpad, a touchscreen, voice or gesture recognition captured by a microphone or video camera, for example, or any other peripheral or control to permit user feedback from and interaction with the processor 710. The interface 740 may further include one or more of ports, disk drives, wireless antennas, or other types of receiver circuitry.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those having ordinary skill in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to an advantage.

Aspects of the present invention may be embodied as an apparatus, method or computer program product. Accordingly, aspects of the present invention may take the form of an entirely hardware embodiment, an entirely software embodiment (including firmware, resident software, microcode, etc.) or an embodiment combining software and hardware aspects that may all generally be referred to herein as a "circuit," "module" or "system." Furthermore, aspects of the present invention may take the form of a computer program product embodied in one or more computer readable medium(s) having computer executable code embodied thereon.

While representative embodiments are disclosed herein, one of ordinary skill in the art appreciates that many variations that are in accordance with the present teachings are possible and remain within the scope of the appended claim set. The invention therefore is not to be restricted except within the scope of the appended claims.

The invention claimed is:

1. A method of measuring modulation distortion (MD) error vector magnitude (EVM) of a device under test (DUT), the method comprising:
   splitting a radio frequency (RF) signal output by the DUT into a first RF signal and a second RF signal using a power splitter;
   acquiring and digitizing the first RF signal in a first channel and the second RF signal in a second channel without demodulating either of the first RF signal or the second RF signal, wherein the first and second channels are independent;
   performing time-alignment, phase alignment and complex equalization, of the first RF signal in the first channel and the second RF signal in the second channel in order to refer each of the first RF signal and the second RF signal to an ideal signal;
   measuring first MD error vectors of the equalized first RF signal in the first channel and second MD error vectors of the equalized second RF signal in the second channel using a processing unit;
   performing cross-correlation between the first and second MD error vectors across the first and second channels to provide cross-correlated MD error vectors of the RF signal output by the DUT;
   averaging the cross-correlated MD error vectors over symbols and packets of the RF signal; and
   dividing the averaged cross-correlated MD error vectors by signal power of the ideal signal to obtain cross-correlated MDEVMs over a time period or bandwidth of a waveform of the RF signal,
   wherein performing the cross-correlation of the first and second MD error vectors and averaging of the cross-correlated MD error vectors suppress contribution of uncorrelated noise introduced by the first and second channels to the first and second MD error vectors, respectively.

2. The method of claim 1, further comprising:
   averaging the cross-correlated MDEVMs over the time period or the bandwidth of the waveform to obtain an aggregate cross-correlated MDEVM for each symbol, for each packet, or for all packets.

3. The method of claim 1, further comprising:
   performing coherent averaging of samples of the first RF signal in the first channel prior to measuring the first MD error vectors, and performing coherent averaging of samples of the second RF signal in the second channel prior to measuring the second MD error vectors,
   wherein the coherent averaging suppresses common mode noise (c(t)) introduced by the DUT, channel noise (n1(t), n2(t)) occurring in the first and second channels, and leakage noise hn1(t) and hn2(t) occurring between the channels.

4. The method of claim 1, further comprising:
   suppressing anti-correlated differential noise (d(t)) introduced by the power splitter, by adding a predetermined amount of thermal noise to the cross-correlated MDEVMs.

5. The method of claim 1, further comprising: suppressing leakage noise (hn1(t), hn2(t)) occurring between the first and second channels and in the power splitter.

6. The method of claim 5, wherein suppressing the leakage noise (hn1(t), hn2(t)) comprises increasing isolation between the first and second channels in the power splitter.

7. The method of claim 5, wherein suppressing the leakage noise (hn1(t), hn2(t)) comprises attenuating at least one of the first RF signal prior to input to the first channel or the second RF signal prior to input to the second channel.

8. The method of claim 5, wherein suppressing the leakage noise (hn1(t), hn2(t)) comprises adding an isolation amplifier in each of the first and second channels.

9. The method of claim 5, wherein suppressing the leakage noise (hn1(t), hn2(t)) comprises:
   measuring a noise spectrum and an undulation of an RF signal noise floor with the power splitter disconnected from the DUT and terminated;
   calibrating the processing unit to improve accuracy of the noise spectrum and the undulation; and
   subsequently applying a frequency domain correction to the cross-correlation of the first and second MD error vectors to remove the undulation from the noise spectrum, while preserving the mean of the noise spectrum.

10. The method of claim 1, wherein the cross-correlation of the first and second MD error vectors is performed in the time-domain using error vectors per time sample in an occupied waveform duration of the RF signal.

11. The method of claim 1, wherein the cross-correlation of the first and second MD error vectors is performed in the frequency-domain using error vectors per frequency sample in an occupied waveform bandwidth of the RF signal.

12. A system for measuring modulation distortion (MD) error vector magnitude (EVM) of a device under test (DUT), the system comprising:
   a power splitter configured to split a radio frequency (RF) signal output by the DUT into a first RF signal and a second RF signal;
   a first channel configured to acquire and digitize the first RF signal without demodulating the first RF signal;
   a second channel configured to acquire and digitize the second RF signal without demodulating the second RF signal;
   a processing unit and a memory storing instructions that, when executed by the processing unit, cause the processing unit to:
   perform time alignment, phase alignment and complex equalization of the first RF signal from the first channel and the second RF signal from the second channel;
   measure first MD error vectors of the equalized first RF signal and second MD error vectors of the equalized second RF signal;
   perform cross-correlation of the first and second MD error vectors across the first and second channels to provide cross-correlated MD error vectors of the RF signal output by the DUT;
   average the cross-correlated MD error vectors over symbols and packets of the RF signal; and
   divide the averaged cross-correlated MD error vectors by signal power of an ideal signal to obtain cross-correlated MDEVMs over a time period or bandwidth of a waveform of the RF signal, wherein performing the cross-correlation of the first and second MD error vectors and averaging of the cross-correlated MD error vectors suppress contribution of uncorrelated noise introduced by the first and second channels to the first and second MD error vectors, respectively.

13. The system of claim 12, wherein the power splitter is a Wilkinson power divider, and wherein the instructions further cause the processing unit to cancel anti-correlated differential noise (d(t)) introduced by the Wilkinson power divider by adding kT watts per Hz of thermal noise to the cross-correlated MDEVMs, where k is Boltzmann constant.

14. The system of claim 12, wherein the power splitter is a resistive power divider, and wherein the instructions further cause the processing unit to cancel anti-correlated differential noise (d(t)) introduced by the resistive power divider by adding −3 kT watts per Hz of thermal noise to the cross-correlated MDEVMs.

15. The system of claim 12, wherein the instructions further cause the processing unit to:
perform coherent averaging of samples of the first RF signal in the first channel prior to measuring the first MD error vectors; and
perform coherent averaging of samples of the second RF signal in the second channel prior to measuring the second MD error vectors,
wherein the coherent averaging of the first and second MD error vectors removes common mode noise (c(t)) introduced by the DUT and suppresses channel noise (n1(t), n2(t)) originating in the first and second channels.

16. The system of claim 12, wherein leakage noise (hn1(t), hn2(t)) occurring in the power splitter is suppressed by increasing isolation between the first and second channels in the power splitter.

17. The system of claim 12, wherein the first channel comprises a first amplifier configured to amplify the first RF signal and a first attenuator configured to attenuate the first RF signal prior, thereby providing isolation to suppress leakage noise (hn1(t), hn2(t)) occurring between the first and second channels; and
wherein the second channel comprises a second amplifier configured to amplify the second RF signal and a second attenuator configured to attenuate the second RF signal, thereby providing isolation to suppress leakage noise (hn1(t), hn2(t)) occurring between the first and second channels.

18. The system of claim 12, wherein the instructions further cause the processing unit to suppress leakage noise (hn1(t), hn2(t)) occurring between the first and second channels and in the power splitter by applying a frequency domain correction to the cross-correlation of the first and second MD error vectors to remove undulation from a measured noise spectrum, while preserving the mean of the noise spectrum.

19. The system of claim 12, wherein performing complex equalization of the first and second RF signals comprises dividing each of the first RF signal and the second RF signal by frequency response of the system to refer each of the first RF signal and the second RF signal to the ideal signal, and to refer each of the first and second MD error vectors to the ideal signal for measuring each of the first and second MD error vectors.

20. A non-transitory computer readable medium storing instructions for measuring modulation distortion (MD) error vector magnitude (EVM) of a device under test (DUT) that outputs a radio frequency (RF) signal, which is split by a power splitter into a first RF signal and a second RF signal, wherein the first RF signal is acquired and digitized in a first channel without being demodulated and the second RF signal is acquired and digitized in a second channel without being demodulated, wherein when executed by a processing unit, the instructions cause the processing unit to:
perform time alignment, phase alignment and complex equalization of the first RF signal from the first channel and the second RF signal from the second channel;
measure first MD error vectors of the equalized first RF signal and second MD error vectors of the equalized second RF signal;
perform cross-correlation of the first and second MD error vectors across the first and second channels to provide cross-correlated MD error vectors of the RF signal output by the DUT;
average the cross-correlated MD error vectors over symbols and packets of the RF signal; and
divide the averaged cross-correlated MD error vectors by signal power of an ideal signal to obtain cross-correlated MDEVMs over a time period or bandwidth of a waveform of the RF signal,
wherein performing the cross-correlation of the first and second MD error vectors and averaging of the cross-correlated MD error vectors suppress contribution of uncorrelated noise introduced by the first and second channels to the first and second MD error vectors, respectively.

* * * * *